United States Patent
Wada et al.

(10) Patent No.: US 11,367,807 B2
(45) Date of Patent: Jun. 21, 2022

(54) NITRIDE SEMICONDUCTOR LIGHT-EMITTING ELEMENT

(71) Applicant: NIKKISO CO., LTD., Tokyo (JP)

(72) Inventors: Mitsugu Wada, Ishikawa (JP); Yusuke Matsukura, Ishikawa (JP); Yuta Furusawa, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 18 days.

(21) Appl. No.: 16/958,579

(22) PCT Filed: Oct. 31, 2018

(86) PCT No.: PCT/JP2018/040539
§ 371 (c)(1),
(2) Date: Jun. 26, 2020

(87) PCT Pub. No.: WO2019/130804
PCT Pub. Date: Jul. 4, 2019

(65) Prior Publication Data
US 2021/0066548 A1  Mar. 4, 2021

(30) Foreign Application Priority Data

Dec. 28, 2017  (JP) .............................. JP2017-254378

(51) Int. Cl.
*H01L 33/32* (2010.01)
*H01L 33/40* (2010.01)

(52) U.S. Cl.
CPC ............ *H01L 33/32* (2013.01); *H01L 33/405* (2013.01)

(58) Field of Classification Search
CPC combination set(s) only.
See application file for complete search history.

(56) References Cited

U.S. PATENT DOCUMENTS

| 6,039,848 | A | 3/2000 | Moskehi et al. |
| 8,093,606 | B2 | 1/2012 | Sonobe et al. |

(Continued)

FOREIGN PATENT DOCUMENTS

| CN | 103682012 A | 3/2014 |
| JP | 2003-60236 A | 2/2003 |

(Continued)

OTHER PUBLICATIONS

International Search Report dated Jun. 15, 20179 issued in PCT/JP2018/040539.

(Continued)

*Primary Examiner* — Ratisha Mehta
(74) *Attorney, Agent, or Firm* — Scully, Scott, Murphy & Presser, PC

(57) ABSTRACT

A nitride semiconductor light emitting element includes a multi-quantum well layer including AlGaN, and including a plurality of well layers and producing light by combining carriers and emitting deep ultraviolet light with a central wavelength of 250 nm to 350 nm, a metal electrode part including Al that is located above the multi-quantum well layer and reflects a first light that is a part of the light produced by the multi-quantum well layer and travels upward, a multi-stacked semiconductor layer that is located between the multi-quantum well layer and the metal electrode part, includes a plurality of p-type semiconductor layers including p-type AlGaN, and is configured in such a manner that the first light travels out and back therewithin via reflection at the metal electrode part until meeting a second light that is a part of the light produced by the multi-quantum well layer and travels downward, and an ITO contact electrode part provided between the metal electrode part and the multi-quantum well layer, and including an indium tin oxide, wherein a difference in refractive index (Continued)

between a p-type semiconductor layer and a layer adjacent thereto in the multi-stacked semiconductor layer is not more than 0.12, wherein the multi-stacked semiconductor layer and the ITO contact electrode part have a film thickness that allows only the first light after traveling out and back within the multi-stacked semiconductor layer and the ITO contact electrode part via the reflection at the metal electrode part, and the second light to meet in the same phase and exit from a lower side of the multi-quantum well layer.

12 Claims, 10 Drawing Sheets

(56) References Cited

U.S. PATENT DOCUMENTS

| | | | |
|---|---|---|---|
| 8,896,085 | B2 | 11/2014 | Sakai |
| 9,153,741 | B1* | 10/2015 | Hirayama ............... H01L 33/32 |
| 10,505,074 | B2 | 12/2019 | Asada et al. |
| 2005/0212005 | A1 | 9/2005 | Misra et al. |
| 2008/0123711 | A1 | 5/2008 | Chua et al. |
| 2008/0144688 | A1 | 6/2008 | Chua et al. |
| 2009/0090932 | A1 | 4/2009 | Bour et al. |
| 2009/0278144 | A1 | 11/2009 | Sonobe et al. |
| 2012/0113658 | A1 | 5/2012 | Sakai |
| 2014/0103289 | A1* | 4/2014 | Liao ................. H01L 21/02507 257/13 |
| 2017/0170364 | A1 | 6/2017 | Jeon |
| 2017/0179918 | A1 | 6/2017 | Jeon |
| 2018/0287014 | A1 | 10/2018 | Asada et al. |
| 2019/0393381 | A1* | 12/2019 | Shibata ................. H01L 33/305 |
| 2020/0287087 | A1* | 9/2020 | Watanabe ............... H01L 33/32 |
| 2020/0335663 | A1* | 10/2020 | Mughal ............... H01L 25/0756 |

FOREIGN PATENT DOCUMENTS

| | | |
|---|---|---|
| JP | 2004-207742 A | 7/2004 |
| JP | 2006-140234 A | 6/2006 |
| JP | 2007-103689 A | 4/2007 |
| JP | 2014-103240 A | 6/2014 |
| JP | 2015-153827 A2 | 8/2015 |
| KR | 20150094318 A | 8/2015 |
| TW | 200735419 A | 6/2007 |
| TW | 201121101 A1 | 6/2011 |
| TW | 201724560 A | 7/2017 |
| WO | WO2015122694 | 8/2015 |

OTHER PUBLICATIONS

JP Office Action dated Jan. 11, 2019 issued in JP 2017-2254378.
JP Office Action dated Aug. 13, 2019 issued in JP 2017-2254378.
A translation of International Preliminary Report on Patentability and Written Opinion dated Jul. 2, 2020 from PCT/JP2018/040539.
Office Action dated Aug. 19, 2019 received from the Taiwanese Patent Office in related application 107138496 together with English language translation.

* cited by examiner

FIG. 3

| | FILM THICKNESS (nm) | REFRACTIVE INDEX | OPTICAL FILM THICKNESS (nm) |
|---|---|---|---|
| p-TYPE CONTACT LAYER 56 (GaN LAYER) | 10.0 | 2.60 | 26.0 |
| SECOND p-TYPE CLADDING LAYER 544 (Al$_{0.5}$Ga$_{0.5}$N LAYER) | 24.7 | 2.50 | 61.8 |
| FIRST p-TYPE CLADDING LAYER 542 (Al$_{0.8}$Ga$_{0.2}$N LAYER) | 20.0 | 2.38 | 47.6 |
| ELECTRON BLOCKING LAYER 52 (AlN LAYER) | 2.0 | 2.30 | 4.6 |

FIG. 4

| SAMPLE No. | FILM THICKNESS (nm) | | | | TOTAL OPTICAL FILM THICKNESS (nm) | TOTAL OPTICAL FILM THICKNESS (×λ, λ=280nm) | EMISSION OUTPUT (ARBITRARY UNIT) |
|---|---|---|---|---|---|---|---|
| | ELECTRON BLOCKING LAYER 52 (AlN LAYER) | FIRST p-TYPE CLADDING LAYER 542 (Al$_{0.8}$Ga$_{0.2}$N LAYER) | SECOND p-TYPE CLADDING LAYER 544 (Al$_{0.5}$Ga$_{0.5}$N LAYER) | p-TYPE CONTACT LAYER 56 (GaN LAYER) | | | |
| 1 | 2 | 20 | — | 20 | 104.20 | 0.372 | 0.93 |
| 2 | 2 | 20 | 22.5 | 10 | 134.45 | 0.480 | 1.63 |
| 3 | 2 | 20 | 27.0 | 10 | 145.70 | 0.520 | 1.85 |
| 4 | 2 | 20 | 35.2 | 10 | 166.20 | 0.594 | 1.75 |
| 5 | 2 | 20 | 40.5 | 10 | 179.45 | 0.641 | 1.45 |
| 6 | 2 | 20 | 54.0 | 10 | 213.20 | 0.761 | 0.86 |
| 7 | 2 | 20 | 81.0 | 10 | 280.70 | 1.003 | 1.42 |

FIG. 6

| SAMPLE No. | FILM THICKNESS (nm) | | | | | TOTAL OPTICAL FILM THICKNESS (nm) | (×λ=280nm) | EMISSION OUTPUT (ARBITRARY UNIT) |
|---|---|---|---|---|---|---|---|---|
| | ELECTRON BLOCKING LAYER 52 (AlN LAYER) | FIRST p-TYPE CLADDING LAYER 542 (Al0.8Ga0.2N LAYER) | SECOND p-TYPE CLADDING LAYER 544 (Al0.5Ga0.5N LAYER) | p-TYPE CONTACT LAYER 56 (GaN LAYER) | ITO ELECTRODE | | | |
| 8 | 2 | 20 | — | 20 | 14 | 132.20 | 0.472 | 0.82 |
| 9 | 2 | 20 | 22.5 | 10 | 14 | 162.50 | 0.580 | 1.62 |
| 10 | 2 | 20 | 27.0 | 10 | 14 | 173.50 | 0.620 | 1.76 |
| 11 | 2 | 20 | 35.2 | 10 | 14 | 194.20 | 0.694 | 1.59 |
| 12 | 2 | 20 | 40.5 | 10 | 14 | 207.50 | 0.741 | 0.90 |
| 13 | 2 | 20 | 54.0 | 10 | 14 | 241.20 | 0.861 | 0.58 |
| 14 | 2 | 20 | 81.0 | 10 | 14 | 308.70 | 1.103 | 0.89 |

FIG. 10

| | FILM THICKNESS (nm) | REFRACTIVE INDEX | OPTICAL FILM THICKNESS (nm) |
|---|---|---|---|
| Al | — | — | — |
| Ti | 2.0 | — | — |
| ITO | 15.0 | 2.00 | 30.0 |
| n-TYPE LAYER 584 (GaN LAYER) | 10.0 | 2.60 | 26.0 |
| p-TYPE LAYER 582 (GaN LAYER) | 10.0 | 2.60 | 26.0 |
| SECOND p-TYPE CLADDING LAYER 544 (Al$_{0.5}$Ga$_{0.5}$N LAYER) | 30.3 | 2.50 | 75.8 |
| FIRST p-TYPE CLADDING LAYER 542 (Al$_{0.8}$Ga$_{0.2}$N LAYER) | 20.0 | 2.38 | 47.6 |
| ELECTRON BLOCKING LAYER 52 (AlN LAYER) | 2.0 | 2.30 | 4.6 |

NITRIDE SEMICONDUCTOR LIGHT-EMITTING ELEMENT

TECHNICAL FIELD

The invention relates to a nitride semiconductor light-emitting element.

BACKGROUND ART

In recent years, nitride semiconductor light-emitting elements such as light-emitting diodes or laser diodes which emit ultraviolet light have been available, and nitride semiconductor light-emitting elements with improved emission intensity have been under development (see Patent Document 1).

CITATION LIST

Patent Document

Patent Document 1: JP 2014-103240A

SUMMARY OF INVENTION

Technical Problem

The semiconductor light-emitting element described in Patent Document 1 includes a first-semiconductor layer having a first conductivity type, a light-emitting layer formed on the first semiconductor layer, a second semiconductor layer having a second conductivity type and formed on the light-emitting layer, a light-transmitting conductive layer formed on the second semiconductor layer and having a lower light refractive index than the second semiconductor layer, and a metal layer formed on the conductive layer, wherein the thickness of the second semiconductor layer is set in such a manner that the phase of directly emitted light from the light-emitting layer and the phase of conductive layer-reflected light from the conductive layer are matched during when traveling from the light-emitting layer toward the first semiconductor layer, and the thickness of the conductive layer is set in such a manner that the phase of the conductive layer-reflected light and the phase of metal layer-reflected light from the metal layer are matched during when traveling from the light-emitting layer toward the first semiconductor layer.

As described above, light extraction efficiency of the semiconductor light-emitting element described in Patent Document 1 is improved by independently setting the respective thicknesses of the second semiconductor layer and the conductive layer in such a manner that the phases of the directly emitted light and the conductive layer-reflected light are matched and the phases of the conductive layer-reflected light and the metal layer-reflected light are matched.

In the meantime, in the semiconductor light-emitting element described in Patent Document 1, a p-type GaN layer is used as the second semiconductor layer. However, the p-type GaN layer has properties of absorbing deep ultraviolet light. Therefore, in the deep ultraviolet light-emitting elements which emit deep ultraviolet light, sufficient light extraction efficiency may not be obtained even when taking measures by independently setting the respective thicknesses of the second semiconductor layer and the conductive layer.

Therefore, it is an object of the invention to provide a nitride semiconductor light-emitting element which can realize improved deep ultraviolet light extraction efficiency.

Solution to Problem

A nitride semiconductor light-emitting element according to an embodiment of the invention comprises a multi-quantum well layer comprising AlGaN, and comprising a plurality of well layers and producing light by combining carriers and emitting deep ultraviolet light with a central wavelength of 250 nm to 350 nm; a metal electrode part comprising Al that is located above the multi-quantum well layer and reflects a first light that is a part of the light produced by the multi-quantum well layer and travels upward; a multi-stacked semiconductor layer that is located between the multi-quantum well layer and the metal electrode part, comprises a plurality of p-type semiconductor layers comprising p-type AlGaN, and is configured in such a manner that the first light travels out and back therewithin via reflection at the metal electrode part until meeting a second light that is a part of the light produced by the multi-quantum well layer and travels downward; and an ITO contact electrode part provided between the metal electrode part and the multi-quantum well layer, and comprising an indium tin oxide, wherein a difference in refractive index between a p-type semiconductor layer and a layer adjacent thereto in the multi-stacked semiconductor layer is not more than 0.12, wherein the multi-stacked semiconductor layer has and the ITO contact electrode part have a film thickness that allows only the first light after traveling out and back within the multi-stacked semiconductor layer and the ITO contact electrode part via the reflection at the metal electrode part, and the second light to meet in the same phase and exit from a lower side of the multi-quantum well layer.

Advantageous Effects of Invention

According to an embodiment of the invention, it is possible to provide a nitride semiconductor light-emitting element which can realize improved deep ultraviolet light extraction efficiency.

BRIEF DESCRIPTION OF DRAWINGS

FIG. 3 is a diagram illustrating an example of the film thickness, refractive index and optical film thickness of each layer constituting a multi-stacked semiconductor layer of the light-emitting element shown in FIG. 1.

FIG. 4 is a diagram illustrating the film thickness of each layer constituting the multi-stacked semiconductor layer and emission output of each sample used in experiments on free end reflection.

FIG. 6 is a diagram illustrating the film thickness of each layer constituting the multi-stacked semiconductor layer and emission output of each sample used in experiments on fixed end reflection.

FIG. 10 is a diagram illustrating an example of the film thickness, refractive index and optical film thickness of each layer constituting the multi-stacked semiconductor layer of the light-emitting element shown in FIG. 9.

DESCRIPTION OF EMBODIMENTS

First Embodiment

The first embodiment of the invention will be described in reference to FIGS. 1 to 3. The embodiments below are described as preferred examples for implementing the invention. Although some part of the embodiments specifically illustrates various technically preferable matters, the technical scope of the invention is not limited to such specific aspects. In addition, a scale ratio of each constituent element in each drawing is not necessarily the same as the actual scale ratio of the nitride semiconductor light-emitting element. In the following description of the embodiments of the invention, "on/upper/upward" means a direction from a substrate 10 (see FIG. 1) toward a p-side electrode 92 (see FIG. 1) to be described later, and "under/lower/downward" means a direction from the p-side electrode 92 (see FIG. 1) toward the substrate 10 (see FIG. 1). In addition, "on/upper/upward" or "under/lower/downward" indicates a relative position of one object to another object, and includes not only a state in which the one object is arranged directly on or under the other object but also a state in which the one object is arranged indirectly on or under the other object with a third object in-between.

Figure 1:
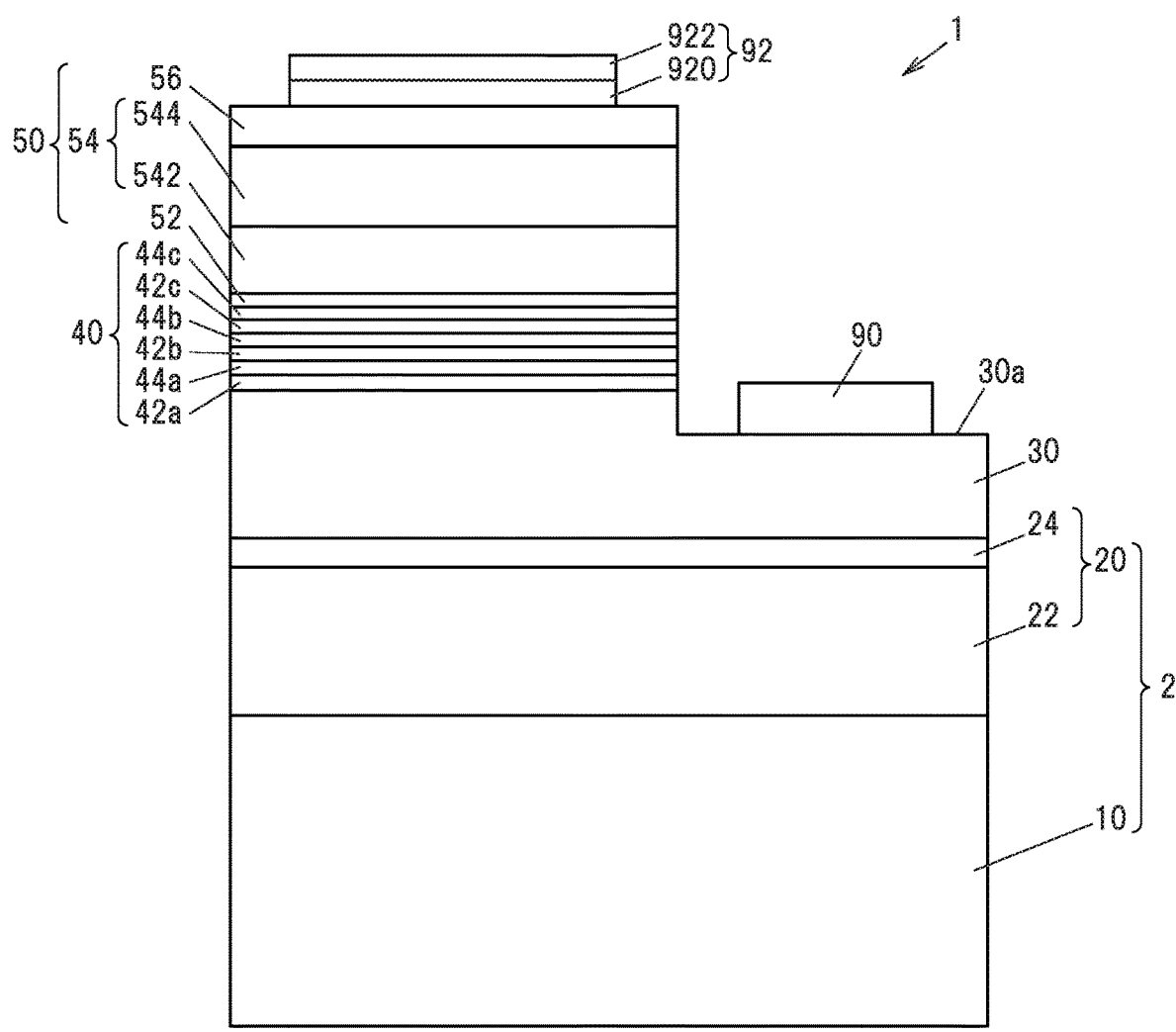
FIG. 1 is a schematic cross-sectional view showing a configuration of a nitride semiconductor light-emitting element in the first embodiment of the present invention.

FIG. 1 is a schematic cross-sectional view showing a configuration of a nitride semiconductor light-emitting element in the first embodiment of the invention. A nitride semiconductor light-emitting element 1 (hereinafter, also simply referred to as "light-emitting element 1") is a light-emitting diode (LED) which emits light with a wavelength in the ultraviolet region. In the first embodiment, the light-emitting element 1 emitting deep ultraviolet light with a central wavelength of 250 nm to 350 nm is specifically described as an example.

As shown in FIG. 1, the light-emitting element 1 includes a substrate 10, a buffer layer 20, an n-type cladding layer 30, an active layer 40 including a multi-quantum well layer, a multi-stacked semiconductor layer 50, an n-side electrode 90 and a p-side electrode 92.

The semiconductor which can be used to form the light-emitting element 1 is, e.g., a binary, ternary, or quaternary group III nitride semiconductor which is expressed by $Al_xGa_yIn_{1-x-y}N$ ($0 \le x \le 1$, $0 \le y \le 1$, $0 \le x+y \le 1$,). In addition, the group III elements thereof may be partially substituted with boron (B) or thallium (Tl), etc., and N may be partially substituted with phosphorus (P), arsenic (As), antimony (Sb) or bismuth (Bi), etc.

The substrate 10 is transparent to deep ultraviolet light emitted by the light-emitting element 1. The substrate 10 is, e.g., a sapphire substrate including sapphire ($Al_2O_3$). Besides the sapphire ($Al_2O_3$) substrate, e.g., aluminum nitride (AlN) substrate or an aluminum gallium nitride (AlGaN) substrate may be used as the substrate 10.

The buffer layer 20 is formed on the substrate 10. The buffer layer 20 includes an AlN layer 22 and a u-$Al_pGa_{1-p}N$ layer 24 ($0 \le p \le 1$) which is undoped and formed on the AlN layer 22. The substrate 10 and the buffer layer 20 constitute a foundation structure 2. However, when the substrate 10 is an AlN substrate or an AlGaN substrate, the buffer layer 20 may not be necessarily provided.

The n-type cladding layer 30 is formed on the foundation structure 2. The n-type cladding layer 30 is a layer formed of AlGaN with n-type conductivity (hereinafter, also simply referred to as "n-type AlGaN") and is, e.g., an $Al_qGa_{1-q}N$ layer ($0 \le q \le 1$) doped with silicon (Si) as an n-type impurity. Alternatively, germanium (Ge), selenium (Se), tellurium (Te) or carbon (C), etc., may be used as the n-type impurity. The n-type cladding layer 30 has a thickness of about 1 μm to 3 μm and is, e.g., about 2 μm in thickness. The n-type cladding layer 30 may have a single layer or a multilayer structure.

The active layer 40 including a multi-quantum well layer is formed on the n-type cladding layer 30. The active layer 40 is a layer including a multi-quantum well layer in which three $Al_rGa_{1-r}N$ barrier layers 42a, 42b, 42c, including the barrier layer 42a located on the n-type cladding layer 30 side and the barrier layer 42c located on an electron blocking layer 52 (described later) side in the multi-quantum well layer, and three $Al_sGa_{1-s}N$ well layers 44a, 44b, 44c ($0 \le r \le 1$, $0 \le s \le 1$, $r > s$) are alternately stacked.

The active layer 40 combines electrons and holes (hereinafter, also referred to as "carriers") within the multi-quantum well layer and produces light which has a predetermined wavelength and travels in both upward and downward directions of the multi-quantum well layer. The active layer 40 is configured to have a band gap of not less than 3.4 eV so that deep ultraviolet light with a wavelength of not more than 350 nm is output. Although the active layer 40 in the first embodiment is provided with three each of the barrier layers 42 and the well layers 44, the number of layers is not necessarily limited to three, and may be not more than two, or not less than four. In addition, in the following description, when any of the three well layers 44a, 44b, 44c needs to be specified and distinguished from the other well layers, the well layer on the n-type cladding layer 30 side will be referred to as the first well layer 44a, the well layer on the multi-stacked semiconductor layer 50 side will be referred to as the third well layer 44c, and the well layer located between the first well layer 44a and the third well layer 44c will be referred to as the second well layer 44b.

The multi-stacked semiconductor layer 50 is formed on the active layer 40. The multi-stacked semiconductor layer 50 is a layer with a multilayer structure including plural p-type semiconductor layers which are formed of p-type semiconductors. In detail, the multi-stacked semiconductor layer 50 is a layer with a multilayer structure which includes, e.g., the electron blocking layer 52, a p-type cladding layer 54 and a p-type contact layer 56. Each layer will be described later.

Figure 2:
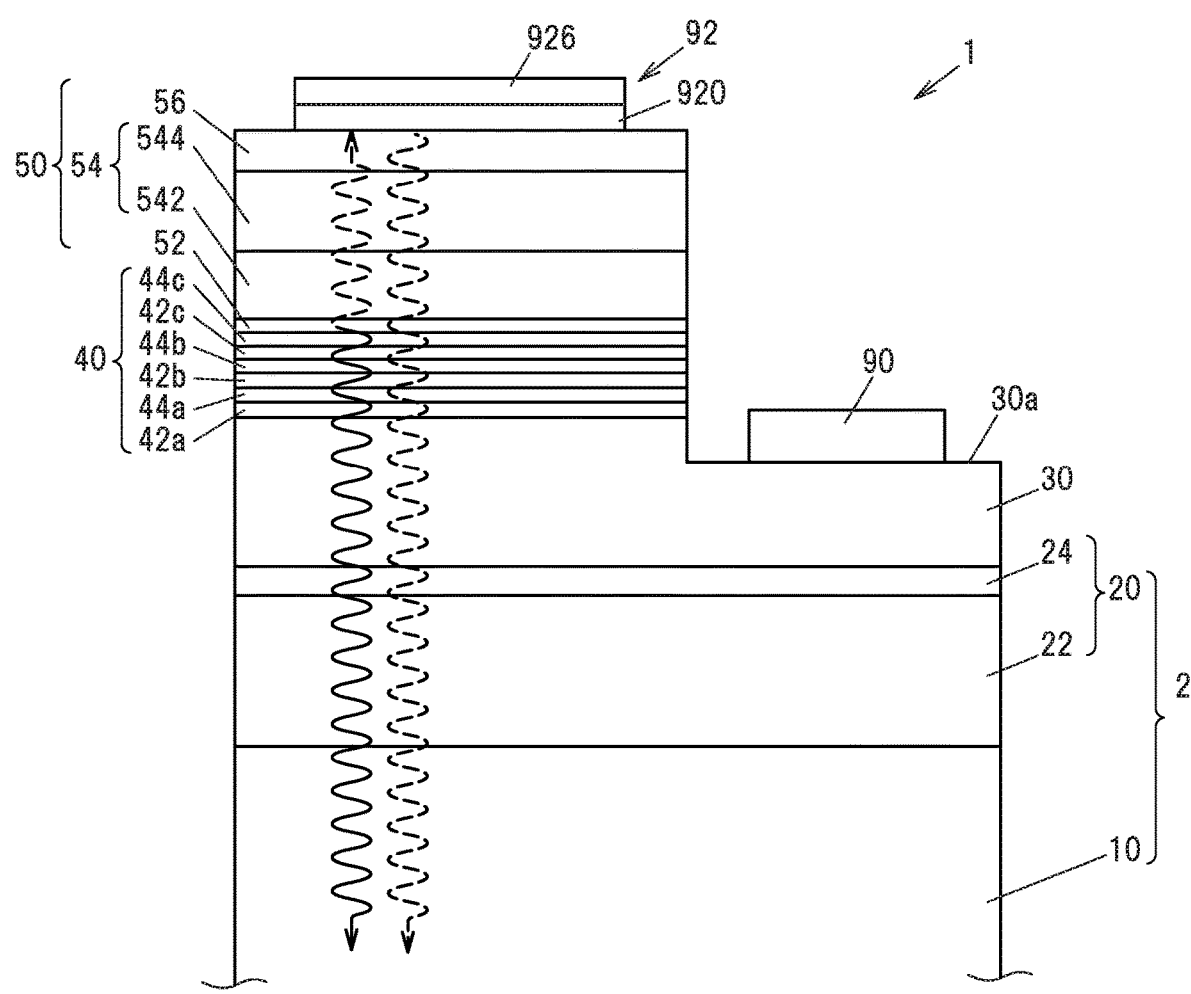
FIG. 2 is a schematic diagram illustrating directly-exiting light and reflected light that propagate within the light-emitting element.

FIG. 2 is a schematic diagram illustrating directly-exiting light and reflected light that propagate within the light-emitting element. The solid-line arrow in FIG. 2 schematically shows light which is a part of the light emitted from the multi-quantum well layer and travels downward (hereinafter, also referred to as "directly-exiting light"). Meanwhile, the dashed-line arrows in FIG. 2 schematically show light which is a part of the light emitted from the multi-quantum well layer, travels upward, is reflected at a metal electrode part 920 (to be described later), and then travels downward (hereinafter, also referred to as "reflected light"). As shown in FIG. 2, the multi-stacked semiconductor layer 50 is a layer which provides a pathway for the reflected light to travel through and in which the reflected light travels out and back until coming back to the position of the multi-quantum well layer, i.e., until meeting the directly-exiting light. The reflected light here is an example of the first light. The directly-exiting light is an example of the second light. In the following description, the "reflected light" includes not only light actually reflected at the metal electrode part 920 but also light not reflected yet and traveling upward, for explanatory convenience.

The electron blocking layer 52 is formed on the active layer 40 side. The electron blocking layer 52 is formed of AlN. The electron blocking layer 52 has a film thickness of about 1 nm to 10 nm. Alternatively, the electron blocking layer 52 may include a layer formed of AlGaN with p-type conductivity (hereinafter, also simply referred to as "p-type AlGaN"). In addition, the electron blocking layer 52 is not necessarily limited to a p-type semiconductor layer and may be an undoped semiconductor layer. The electron blocking layer 52 is an example of the p-type semiconductor layer.

The p-type cladding layer 54 is formed on the electron blocking layer 52. The p-type cladding layer 54 is a layer formed of p-type AlGaN and is, e.g., an $Al_tGa_{1-t}N$ layer ($0 \le t \le 1$) doped with magnesium (Mg) as a p-type impurity. Alternatively, zinc (Zn), beryllium (Be), calcium (Ca), strontium (Sr) or barium (Ba), etc., may be used as the p-type impurity. The p-type cladding layer 54 is an example of the p-type semiconductor layer.

Preferably, the p-type cladding layer 54 has two p-type cladding layers respectively formed of two types of p-type AlGaN with different AlN mole fractions (hereinafter, also referred to as "Al composition ratio"). In detail, the p-type cladding layer 54 includes a first p-type cladding layer 542 located on the electron blocking layer 52 side and formed of p-type $Al_uGa_{1-u}N$ ($0 \le u \le 1$) with a first Al composition ratio u, and a second p-type cladding layer 544 located on the p-type contact layer 56 side and formed of p-type $Al_vGa_{1-v}N$ ($0 < v \le 1$) with a second Al composition ratio v.

Preferably, the second Al composition ratio v is lower than the first Al composition ratio u. In other words, the relation is v<u. More preferably, the first Al composition ratio u is, e.g., about 0.80 (i.e., $Al_{0.8}Ga_{0.2}N$) and the second Al composition ratio v is, e.g., about 0.50 (i.e., $Al_{0.5}Ga_{0.5}N$). Alternatively, the second Al composition ratio v may gradually decrease from the p-type $Al_uGa_{1-u}N$ layer with the first Al composition ratio u toward the p-type contact layer 56 to provide a composition gradient layer. The p-type cladding layer 54 is not limited to a multilayer structure and may be a single layer.

The p-type contact layer 56 is formed on the p-type cladding layer 54. The p-type contact layer 56 is, e.g., a layer of p-type GaN (hereinafter, also referred to as "p-GaN") doped with a high concentration of impurity such as Mg. The p-type contact layer 56 is an example of the p-type semiconductor layer.

The n-side electrode 90 is formed on a certain region of the n-type cladding layer 30. The n-side electrode 90 is formed of, e.g., a multilayered film formed by sequentially stacking titanium (Ti), aluminum (Al), Ti and gold (Au) on the n-type cladding layer 30.

The p-side electrode 92 is formed on the p-type contact layer 56. The p-side electrode 92 includes the metal electrode part 920 located on the p-type contact layer 56 side and formed of a metal, and a pad electrode part 926 formed on the metal electrode part 920. As the metal material for forming the metal electrode part 920, it is possible to use, e.g., aluminum (Al), gold (Au), silver (Ag) or nickel (Ni), etc. Preferably, the metal electrode part 920 is formed of aluminum (Al). It is because reflectivity to deep ultraviolet light can be improved by using Al as the material of the metal electrode part 920. The reflectivity of Al to deep ultraviolet light is about 90%. In the case that the metal electrode part 920 is Al, a metal layer of Ti (titanium), Ni (nickel) or Pd (palladium), etc., having a thickness of not more than about 5 nm may be inserted between the p-type contact layer and the Al electrode. This insertion of the metal layer can enhance adhesion between the p-type contact layer and the metal electrode almost without decreasing reflectivity to deep ultraviolet light.

FIG. 3 is a diagram illustrating an example of the film thickness, refractive index and optical film thickness of each layer constituting the multi-stacked semiconductor layer 50 of the light-emitting element 1 shown in FIG. 1. The optical film thickness is an example of the optical path length in the film thickness direction. The optical film thickness (nm) here is a value obtained by multiplying the film thickness (nm) by the refractive index. The refractive indices are values measured with light having a wavelength of 280 nm, as an example. In the following description, the actual film thickness (nm) is simply referred to as the "film thickness" to distinguish from the "optical film thickness".

As an example, the film thickness of each layer can be appropriately adjusted in such a manner that the optical film thicknesses of the electron blocking layer 52, the first p-type cladding layer 542, the second p-type cladding layer 544 and the p-type contact layer 56 at 280 nm are respectively 4.6 nm, 47.6 nm, 61.8 nm and 26.0 nm, as shown in FIG. 3. In this case, the optical film thickness of the multi-stacked semiconductor layer 50 (hereinafter, also referred to as "total optical film thickness") is 140.0 nm (26.0 nm+61.8 nm+47.6 nm+4.6 nm). This value is equivalent to half (0.5 times) the wavelength of 280 nm.

Experiments to Investigate Relation Between Total Optical Film Thickness and Emission Intensity in the Case of Free End Reflection Next, a relation between the total optical film thickness and the emission intensity will be described in reference to FIGS. 4 and 5. Samples of a flip-chip type, i.e., samples configured to extract light from the substrate 10 side, will be described below as an example. The present inventors conducted experiments to investigate a relation between the total optical film thickness, i.e., the optical film thickness of the multi-stacked semiconductor layer 50, and the emission intensity for the purpose of evaluating a phase difference between the directly-exiting light and the reflected light, and a relationship of mutual amplification between the directly-exiting light and the reflected light.

In detail, the present inventors made seven samples (Sample Nos. 1 to 7) with different total optical thicknesses and conducted experiments to measure the emission intensity of each sample (arbitrary unit, compared to existing products of our company).

For convenience of experiments, light-emitting elements not having the p-side electrode 92 were used as the seven samples. Thus, in such samples, the reflected light is reflected at the interface between air and the p-type contact layer 56, not at the interface between the metal electrode part 920 and the p-type contact layer 56. This reflection is reflection of light traveling in a layer with a relatively high refractive index (about 2.60, see FIG. 3) and hitting a layer with a relatively low refractive index (about 1.0) and is thus fee-end reflection which does not cause a phase change of the reflected light. As for an emission wavelength (nm) to measure the emission output, ultraviolet light with a wavelength of 280 nm was used.

FIG. 4 is a diagram illustrating the film thicknesses of the electron blocking layer, the p-type cladding layer and the p-type contact layer, and the emission output of each sample used in the experiments. Samples with seven types of total optical film thicknesses as shown in FIG. 4 were prepared and the emission output of each sample was measured. The total optical film thicknesses shown in FIG. 4 were calculated using the refractive index of each layer shown in FIG. 3. That is, the total optical film thickness (nm) was calculated based on the film thickness (nm) of the electron blocking layer 52×2.30+the film thickness (nm) of the first p-type cladding layer 542×2.38+the film thickness (nm) of the second p-type cladding layer 544×2.50+the film thickness (nm) of the p-type contact layer 56×2.60. In addition, a ratio of the total optical film thickness (nm) to the measurement wavelength (280 nm) for each sample was shown in the section "Total optical film thickness (xλ=280 nm)" in FIG. 4.

In the example described below, light is produced in the third well layer 44c which is located on the electron blocking layer 52 side among the three well layers 44. The multi-stacked semiconductor layer 50 is a pathway through which the directly-exiting light does not travel and only the reflected light travels (see FIG. 2). Therefore, a distance that the reflected light travels out and back within the multi-stacked semiconductor layer 50 in the film thickness direction, i.e., a length twice the total optical film thickness, corresponds to a difference in path length between the reflected light and the directly-exiting light (i.e., an optical path difference).

Figure 5:
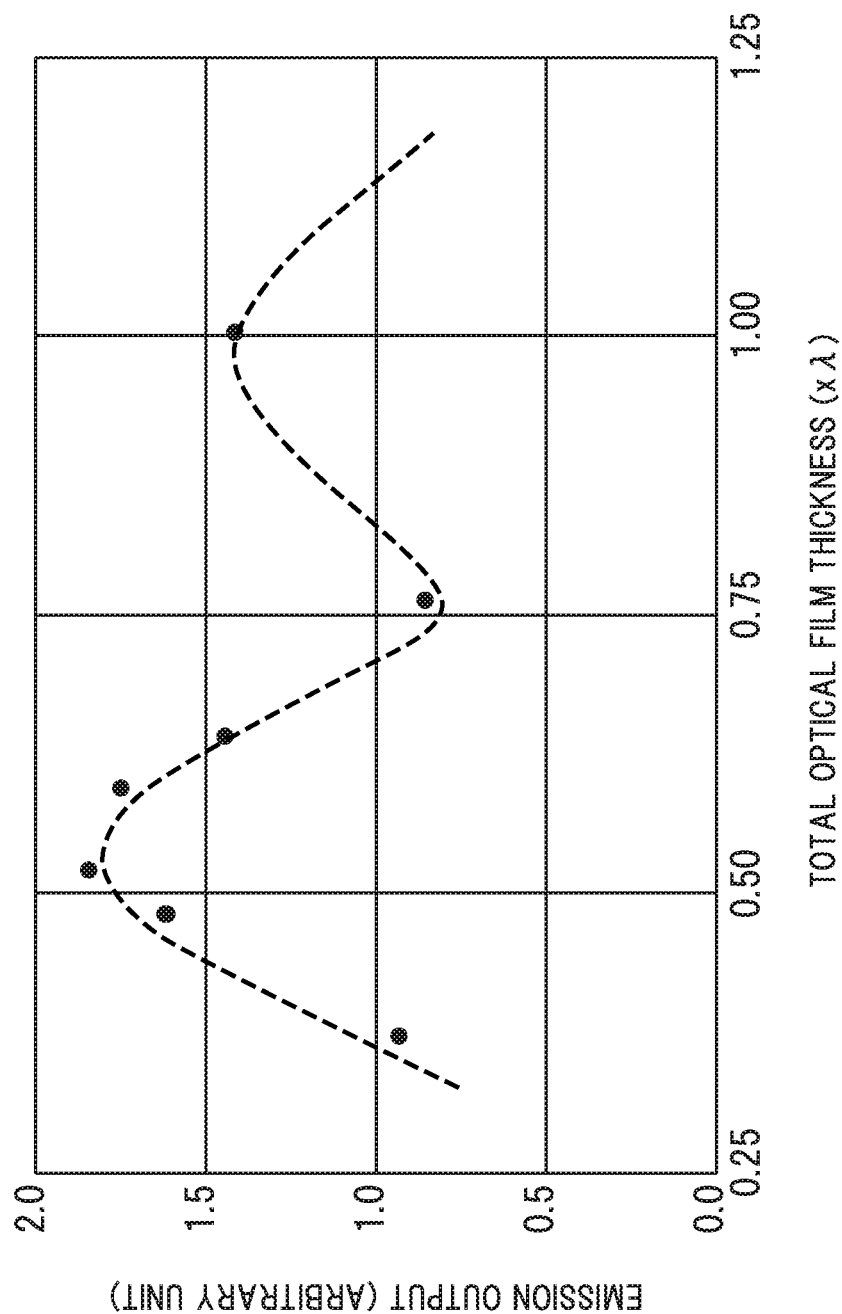
FIG. 5 is a graph showing an example of experiment result which shows a relation between a total optical film thickness and emission intensity in the case of free end reflection.

FIG. 5 is a graph showing an example of experiment result which shows a relation between the total optical film thickness and the emission intensity in the case of free end reflection. In FIG. 5, the horizontal axis indicates the total optical film thickness (xλ) and the vertical axis indicates the emission output (arbitrary unit). The relation between the total optical film thickness (xλ) and the emission output (arbitrary unit) shown in FIG. 4 is plotted and indicated by each dot in FIG. 5. The dashed line in FIG. 5 is a line schematically showing a pattern of change in the emission output (arbitrary unit) with respect to the total optical film thickness (xλ).

As shown in FIG. 5, the emission output changes with respect to the total optical film thickness in such a manner that local maximum and local minimum are repeated at predetermined intervals. In detail, the emission output changes with respect to the total optical film thickness in such a manner that local maximum and local minimum are repeated at intervals of about 0.25 (xλ). In more detail, the emission output changes in such a manner as to have a local maximum at the total optical film thickness of around 0.5 (xλ) and around 1.0 (xλ) and a local minimum at the total optical film thickness of around 0.25 (xλ) and around 0.75 (xλ).

As such, the emission output periodically changes in such a manner as to have a local maximum when the total optical film thickness is an integral multiple of about 0.5 (xλ). When the total optical film thickness has a value equal to an integral multiple of about 0.5 (xλ), the reflected light travels out and back within the multi-stacked semiconductor layer 50 and thus travels a distance of an integral multiple of the wavelength λ (0.5λ×2) more than the directly-exiting light before returning to the third well layer 44c via reflection at the upper surface of the p-type contact layer 56, i.e., before meeting the directly-exiting light. It is therefore considered that the directly-exiting light and the reflected light amplified each other by meeting in phase and then exited from the lower side of the multi-quantum well layer.

Meanwhile, the emission output periodically changes in such a manner as to have a local minimum when the total optical film thickness is an integral multiple of about 0.5 (xλ)+0.25 (xλ). When the total optical film thickness has a value equal to an integral multiple of about 0.5 (xλ)+0.25 (xλ), the reflected light travels a distance of an integral multiple of the wavelength λ+0.5 (xλ) more than the directly-exiting light before meeting the directly-exiting light. It is therefore considered that the directly-exiting light and the reflected light weakened each other by meeting in opposite phase and then exited from the lower side of the multi-quantum well layer.

As described above, it was found that when the optical film thickness of the multi-stacked semiconductor layer 50 as a pathway for only the reflected light is equivalent to an integral multiple of the wavelength, the directly-exiting light and the reflected light amplify each other and light extraction efficiency can thus be improved.

Relation Between Total Optical Film Thickness and Emission Intensity in the Case of Fixed end Reflection Next, a relation between the total optical film thickness and the emission output of other samples will be described in reference to FIGS. 6 and 7. For the purpose of evaluating how a phase difference between the directly-exiting light and the reflected light relates to mutual amplification of the directly-exiting light and the reflected light in the case of fixed end reflection, the present inventors made seven samples (Sample Nos. 8 to 14) with different total optical thicknesses and conducted experiments to measure the emission intensity of each sample (arbitrary unit, compared to existing products of our company), in addition to the experiments on the free end reflection described above.

In the same manner as the experiments on the free end reflection, samples of a flip-chip type will be described below as an example. In addition, a length twice the total optical film thickness corresponds to a difference in path length between the reflected light and the directly-exiting light (i.e., an optical path difference), as described above.

For convenience of experiments, light-emitting elements based on the light-emitting element 1 in the first embodiment of the invention and further provided with an ITO electrode between the metal electrode part 920 and the p-type contact layer 56 were used as the seven samples (Sample Nos. 8 to 14). In such samples, the reflected light is reflected at the interface between the metal electrode part 920 and the p-type contact layer 56. The refractive index of the metal electrode part 920 is higher than the refractive index of the p-type contact layer 56. Thus, reflection at the metal electrode part 920 is fixed end reflection which causes a phase change by λ (180°, equivalent to half the wavelength).

FIG. 6 is a diagram illustrating the film thicknesses of the electron blocking layer, the p-type cladding layer and the p-type contact layer, and the emission output of each sample used in the experiments. Samples with seven types of total optical film thicknesses as shown in FIG. 6 were prepared and the emission output of each sample was measured. The total optical film thicknesses shown in FIG. 6 were calculated using the refractive index of each layer shown in FIG. 3.

Figure 7:
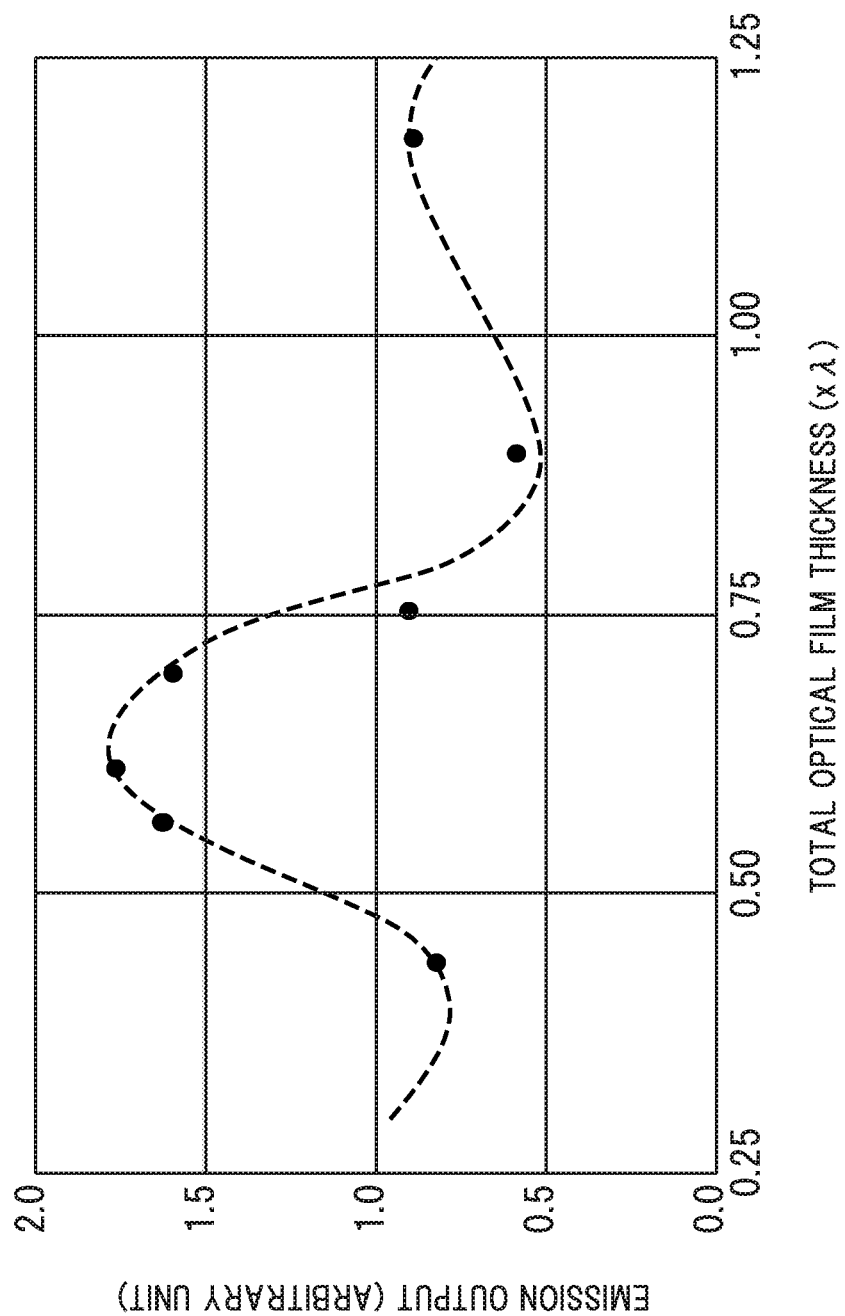
FIG. 7 is a graph showing an example of a relation between the total optical film thickness and the emission intensity in the case of fixed end reflection.

FIG. 7 is a graph showing an example of a relation between the total optical film thickness and the emission intensity in the case of fixed end reflection. The relation between the total optical film thickness (xλ) and the emission output (arbitrary unit) shown in FIG. 6 is plotted and indicated by each dot in FIG. 7. As shown in FIG. 7, the emission output changes with respect to the total optical film thickness in such a manner that local maximum and local minimum are repeated at predetermined intervals. In detail, the emission output changes with respect to the total optical film thickness in such a manner that local maximum and local minimum are repeated at intervals of about 0.25 (xλ). The actual local maximum and minimum in FIG. 7 are present on the slightly smaller side of an integral multiple of about 0.25 (xλ). This is an effect of light traveling in a diagonal direction relative to the metal electrode part 920, which will be described later.

As such, except that the effect of light traveling in a diagonal direction relative to the metal electrode part 920, the emission output periodically changes in such a manner as to have a local maximum when the total optical film thickness is an integral multiple of about 0.5 (xλ)+0.25 (xλ). When the total optical film thickness has a value equal to an integral multiple of about 0.5 (xλ)+0.25 (xλ), the reflected light travels a distance of an integral multiple of the wavelength λ+0.5 (xλ) more than the directly-exiting light before meeting the directly-exiting light. In addition, the phase of the reflected light changes by half the wavelength when being reflected, as described above. It is therefore considered that directly-exiting light and the reflected light amplified each other by meeting in phase and then exited from the lower side of the multi-quantum well layer.

Meanwhile, the emission output periodically changes in such a manner as to have a local minimum when the total optical film thickness is an integral multiple of about 0.5 (xλ). When the total optical film thickness has a value equal to an integral multiple of about 0.5 (xλ), the reflected light travels a distance of an integral multiple of the wavelength λ (0.52λ×2) more than the directly-exiting light before meeting the directly-exiting light. In addition, the phase of the reflected light changes by half the wavelength when being reflected, as described above. It is therefore considered that the directly-exiting light and the reflected light weakened each other by meeting in opposite phase and then exited from the lower side of the multi-quantum well layer.

As described above, it was found that when the total film thickness of the multi-stacked semiconductor layer 50 as a pathway for only the reflected light is equivalent to an integral multiple of the wavelength+a predetermined value, the directly-exiting light and the reflected light amplify each other and light extraction efficiency can thus be improved.

Figure 8:
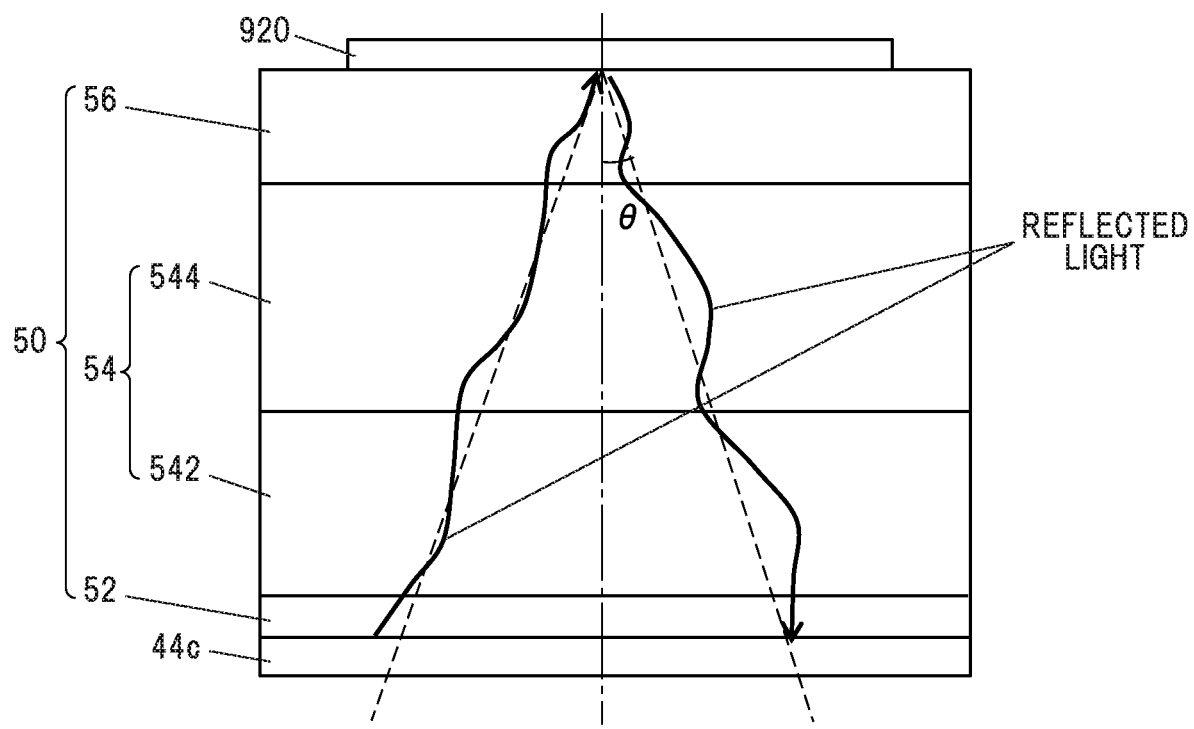
FIG. 8 is a schematic diagram illustrating reflected light which is reflected in a diagonal direction relative to a metal electrode part.

FIG. 8 is a schematic diagram illustrating reflected light which is reflected in a diagonal direction relative to the metal electrode part 920. From the third well layer 44c to the metal electrode part 920 extracted from the configuration of the light-emitting element 1 of FIG. 1 are shown in FIG. 8. In the example described above, the reflected light which is reflected by hitting the metal electrode part 920 in a direction of intersecting at a right angle (in the vertical direction of FIG. 8) was described as an example, for explanatory convenience. In the example described below, reflected light which is reflected by diagonally hitting the metal electrode part 920 will be described. The dash-dot line in FIG. 8 is a projection line indicating the direction of intersecting the metal electrode part 920 at a right angle, and the second diagonal dashed line indicates a travel direction of the reflected light. The arrows in FIG. 8 schematically show how the reflected light travels within the multi-stacked semiconductor layer 50.

Since the reflected light, which is reflected in a diagonal direction relative to the metal electrode part 920, travels within the multi-stacked semiconductor layer 50 in a direction diagonal to the thickness direction of each layer, the light path length of such reflected light is longer than that when traveling in the thickness direction of each layer. Therefore, the emission output has a local maximum at the total optical film thickness smaller than an integral multiple of about 0.5 (xλ)+0.25 (xλ).

In detail, the emission output has a local maximum when the total optical film thickness is Cos θ°×(an integral multiple of 0.5 (xλ)+0.25 (xλ)), where θ° is an angle formed by a direction of the reflected light and a direction of intersecting the metal electrode part 920 at a right angle, as shown in FIG. 8. In case that θ is, e.g., 20°, the emission output has a local maximum when the total optical film thickness is 0.94×(an integral multiple of 0.5 (xλ)+0.25 (xλ)).

Preferably, the total optical film thickness is 0.65 (xλ) ±0.15 (xλ), i.e., from 0.50 (xλ) to 0.80 (xλ). In other words, the film thickness of the multi-stacked semiconductor layer 50 is from 60 nm to 100 nm. This is because when the total optical film thickness is more than 0.80 (xλ), it is considered that an increase in electrical resistance may occur due to an increase in the film thickness of the layers formed of p-type AlGaN and cause a decrease in emission output even with the conditions under which the emission output can have a local maximum. On the other hand, when the total optical film thickness is less than 0.50 (xλ), it is considered that it may not be easy to form the multi-stacked semiconductor layer 50 which spans from the electron blocking layer 52 to the p-type contact layer 56.

Functions and Effects of the First Embodiment

As described above, in the light-emitting element 1 in the first embodiment of the invention, the film thickness of the multi-stacked semiconductor layer 50 is set in such a manner that the reflected light meets the directly-exiting light in phase during when traveling out and back within the multi-stacked semiconductor layer 50 including, e.g., the electron blocking layer 52, the p-type cladding layer 54 and the p-type contact layer 56, and then exits from the lower side of the multi-quantum well layer. As a result, the directly-exiting light and the reflected light amplify each other and it is thus possible to improve deep ultraviolet light extraction efficiency of the light-emitting element 1.

Modification

Although the light emitted from the third well layer 44c has been exemplified in the example described above, it may be light produced by the first well layer 44a or the second well layer 44b. In this case, the film thickness of each layer may be set in such a manner that the optical path length from an interface between any of the well layers 44a, 44b, 44c emitting light and a layer adjacent thereto, i.e., from the upper surface of the any of the well layers 44a, 44b, 44c, to the metal electrode part 920 is Cos θ°×(an integral multiple of 0.5 (xλ)+0.25 (xλ)).

Second Embodiment

Figure 9:
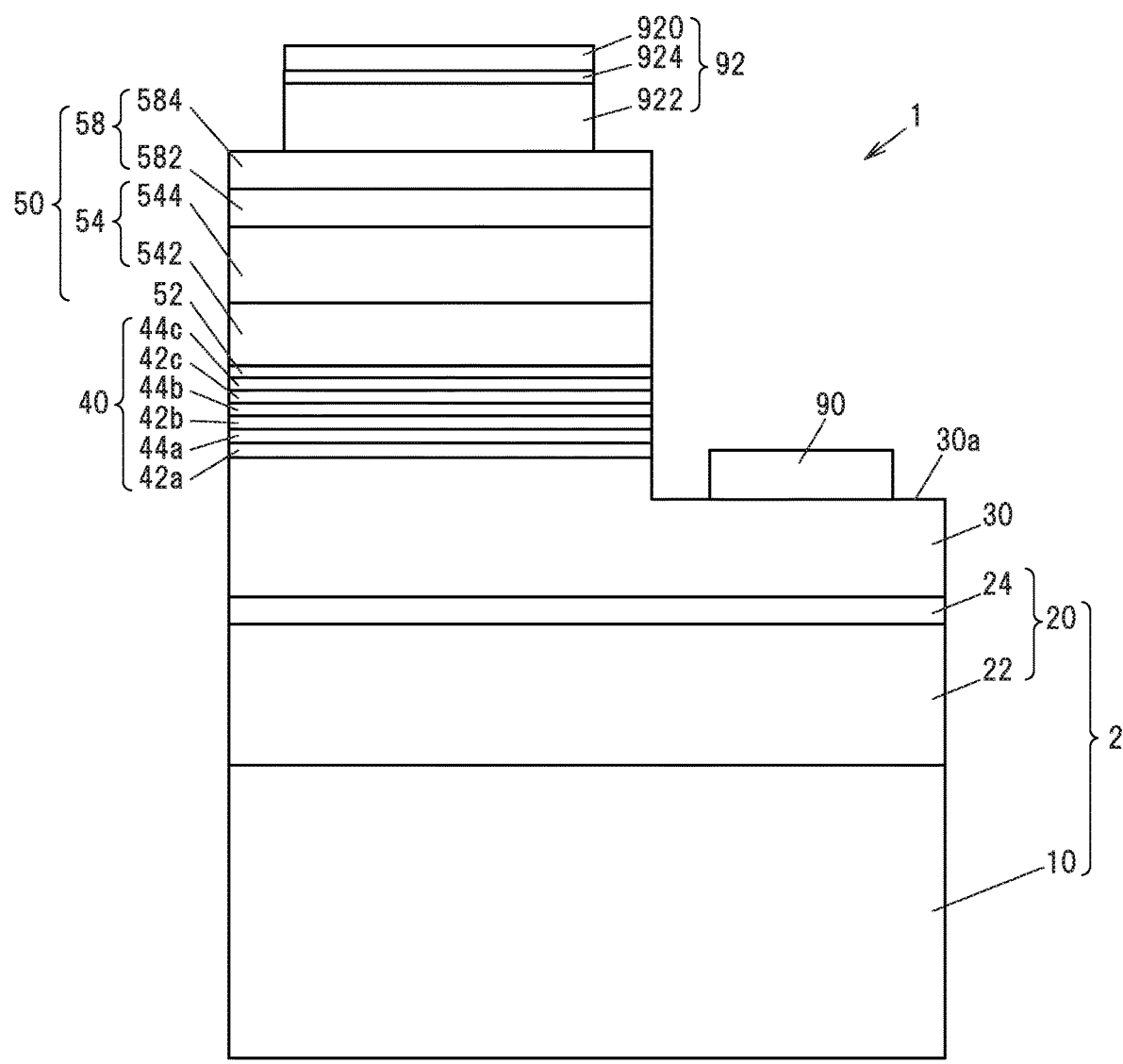
FIG. 9 is a schematic cross-sectional view showing a configuration of the light-emitting element in the second embodiment of the invention.

FIG. 9 is a schematic vertical cross-sectional view showing a configuration of the light-emitting element 1 in the second embodiment of the invention. The light-emitting element 1 in the second embodiment of the invention is different from the light-emitting element 1 in the first embodiment in that a tunnel junction is provided. Hereinafter, the same constituent elements as those in the first embodiment are denoted by the same reference numerals, the overlapping explanation thereof will be omitted, and the difference from the first embodiment will be mainly described.

As shown in FIG. 9, the light-emitting element 1 is configured in such a manner that a tunnel junction 58 which connects a layer including an n-type semiconductor to a layer including a p-type semiconductor by tunneling is provided in place of the p-type contact layer 56 on the p-type cladding layer 54. The tunnel junction 58 includes a p-type layer 582 formed of, e.g., a p-type semiconductor such as p-GaN, and an n-type layer 584 formed of, e.g., an n-type semiconductor such as n-type GaN with n-type conductivity (hereinafter, also referred to as "n-GaN").

The p-side electrode 92 has the metal electrode part 920, and also has, between the metal electrode part 920 and the tunnel junction 58, an ITO contact electrode part 922 located on the tunnel junction 58 side, including an indium tin oxide (ITO) and excellent in ohmic characteristics, and a Ti electrode part 924 located between the metal electrode part 920 and the ITO contact electrode part 922. The Ti electrode part 924 improves adhesion between the metal electrode part 920 and the ITO contact electrode part 922 and prevents potential corrosion or separation of the metal electrode part 920 and the ITO contact electrode part 922. In addition, the Ti electrode part 924 preferably has a film thickness of not more than about 5 nm. This is so that a decrease in reflectivity of the metal electrode part 920 caused by increasing the film thickness of the Ti electrode part 924 is suppressed. Alternatively, an electrode part including Ni or Pd may be used in place of the Ti electrode part 924.

FIG. 10 is a diagram illustrating an example of the film thickness, refractive index and optical film thickness of each layer constituting the multi-stacked semiconductor layer 50 of the light-emitting element 1 shown in FIG. 9. As an example, the film thickness of each layer can be appropriately adjusted so that the optical film thicknesses of the electron blocking layer 52, the first p-type cladding layer 542, the second p-type cladding layer 544, the p-type layer 582, the n-type layer 584 and the ITO contact electrode part 922 at 280 nm are respectively 4.6 nm, 47.6 nm, 75.8 nm, 26.0 nm, 26.0 nm and 30.0 nm, as shown in FIG. 10. In this case, the total optical film thickness of the layer between the multi-quantum well layer and the metal electrode part 920 is 210.0 nm (30.0 nm+26.0 nm+26.0 nm+75.8 nm+47.6 nm+4.6 nm). This value is equivalent to 0.75 times the wavelength of 280 nm.

Functions and Effects of the Second Embodiment

Also in the light-emitting element 1 in the second embodiment of the invention, by adjusting the total optical film thickness to a predetermined value, the directly-exiting light and the reflected light amplify each other and it is thus possible to improve deep ultraviolet light extraction efficiency of the light-emitting element 1.

Summary of the Embodiments

Technical ideas understood from the embodiments will be described below citing the reference numerals, etc., used for the embodiments. However, each reference numeral, etc., described below is not intended to limit the constituent elements in the claims to the members, etc., specifically described in the embodiments.

[1] A nitride semiconductor light-emitting element (1), comprising: a multi-quantum well layer comprising AlGaN, and comprising a plurality of well layers (44) and producing light by combining carriers and emitting deep ultraviolet light with a central wavelength of 250 nm to 350 nm; a metal electrode part (920) comprising Al that is located above the multi-quantum well layer and reflects a first light that is a part of the light produced by the multi-quantum well layer and travels upward; a multi-stacked semiconductor layer (50) that is located between the multi-quantum well layer and the metal electrode part (920), comprises a plurality of p-type semiconductor layers comprising p-type AlGaN, and is configured in such a manner that the first light travels out and back therewithin via reflection at the metal electrode part (920) until meeting a second light that is a part of the light produced by the multi-quantum well layer and travels downward; and an ITO contact electrode part (922) provided between the metal electrode part (920) and the multi-quantum well layer (50), and comprising an indium tin oxide, wherein a difference in refractive index between a p-type semiconductor layer and a layer adjacent thereto in the multi-stacked semiconductor layer (50) is not more than 0.12, wherein the multi-stacked semiconductor layer (50) has and the ITO contact electrode part (922) have a film thickness that allows only the first light after traveling out and back within the multi-stacked semiconductor layer (50) and the ITO contact electrode part (922) via the reflection at the metal electrode part (920), and the second light to meet in the same phase and exit from a lower side of the multi-quantum well layer.

[2] The nitride semiconductor light-emitting element (1) described in the above [1], wherein the optical path length through the multi-stacked semiconductor layer (50) in the film thickness direction is substantially equal to a value obtained by adding an integral multiple of half a wavelength of the first light to one-quarter the wavelength.

[3] The nitride semiconductor light-emitting element (1) described in the above [2], wherein the optical path length through the multi-stacked semiconductor layer (50) in the film thickness direction is substantially equal to a value obtained by adding an integral multiple of half a wavelength of the first light to one-quarter the wavelength and then multiplied by Cos θ°, where θ° is an angle formed by the film thickness direction of the multi-stacked semiconductor layer (50) and the first light.

[4] The nitride semiconductor light-emitting element (1) described in the above [3], wherein the optical path length through the multi-stacked semiconductor layer (50) in the film thickness direction is within the range of 0.5 times to 0.8 times the wavelength of the first light.

[5] The nitride semiconductor light-emitting element (1) described in any one of the above [1] to [4], wherein the multi-stacked semiconductor layer (50) has a film thickness in the range from 60 nm to 100 nm.

[6] The nitride semiconductor light-emitting element (1) described in any one of the above [1] to [4], wherein the optical path length, from an upper surface of any of the plurality of well layers (44) constituting the multi-quantum well layer to the interface between the multi-stacked semiconductor layer (50) and the metal electrode part (920), is substantially equal to a value obtained by adding an integral multiple of half a wavelength of the first light to one-quarter the wavelength.

[7] The nitride semiconductor light-emitting element (1) described in the above [6], wherein the optical path length, from an upper surface of any of the plurality of well layers (44) constituting the multi-quantum well layer to the interface between the multi-stacked semiconductor layer (50) and the metal electrode part (920), is substantially equal to a value obtained by adding an integral multiple of half a wavelength of the first light to one-quarter the wavelength and then multiplied by Cos θ°.

[8] The nitride semiconductor light-emitting element (1) described in any one of the above [1] to [4], wherein the multi-stacked semiconductor layer (50) comprises an electron blocking layer (52) located on the multi-quantum well layer side and a p-type cladding layer (54) located on the electron blocking layer (52) and comprising p-type AlGaN.

[9] The nitride semiconductor light-emitting element (1) described in any one of the above [1] to [4], wherein the multi-stacked semiconductor layer (50) further comprises a p-type contact layer (56) that is located on the p-type cladding layer (54) and comprises p-type GaN.

[10] The nitride semiconductor light-emitting element (1) described in the above [9], wherein the p-type cladding layer (54) comprises a first p-type cladding layer (542) located on the electron blocking layer (52) side and comprising p-type AlGaN with a first composition ratio, and a second p-type cladding layer (544) located on the p-type contact layer (56) side and comprising p-type AlGaN with a second composition ratio smaller than the first composition ratio.

[11] The nitride semiconductor light-emitting element (1) described in any one of the above [1] to [4], wherein the multi-stacked semiconductor layer (50) further comprises a tunnel junction (58) that is located on the p-type cladding layer (54).

[12] The nitride semiconductor light-emitting element (1) described in the above [11], wherein the tunnel junction (58) comprises a p-type layer (582) comprising a p-type semiconductor and an n-type layer (584) comprising an n-type semiconductor.

[13] The nitride semiconductor light-emitting element (1) described in the above [12], further comprising: an electrode part located between the metal electrode part (920) and the ITO contact electrode part (922) and comprising Ti, Ni or Pd.

REFERENCE SIGNS LIST

1: nitride semiconductor light-emitting element (light-emitting element)
44: well layer
50: multi-stacked semiconductor layer
52: electron blocking layer
54: p-type cladding layer
542: first p-type cladding layer
544: second p-type cladding layer
56: p-type contact layer
58: tunnel junction
582: p-type layer
584: n-type layer
920: metal electrode part
922: ITO contact electrode part

The invention claimed is:

1. A nitride semiconductor light-emitting element, comprising:
a multi-quantum well layer comprising AlGaN, and comprising a plurality of well layers and producing light by combining carriers and emitting deep ultraviolet light with a central wavelength of 250 nm to 350 nm;
a p-side electrode located above the multi-quantum well layer and reflects a first light that is a part of the light produced by the multi-quantum well layer and travels upward, the p-side electrode comprising:
a metal electrode part comprising Al;
an ITO contact electrode part provided between the metal electrode part and the multi-quantum well layer, the ITO contact electrode comprising an indium tin oxide, and
an electrode part located between the metal electrode part and the ITO contact electrode part and comprising TI, NI or Pd, the electrode part having a film thickness of not more than 5 nm; and
a multi-stacked semiconductor layer that is located between the multi-quantum well layer and the p-side electrode, comprises a plurality of p-type semiconductor layers comprising p-type AlGaN, and is configured in such a manner that the first light travels out and back therewithin via reflection at the metal electrode part until meeting a second light that is a part of the light produced by the multi-quantum well layer and travels downward;
wherein a difference in refractive index between a p-type semiconductor layer and a layer adjacent thereto in the multi-stacked semiconductor layer is not more than 0.12,
wherein the multi-stacked semiconductor layer and the ITO contact electrode part have a film thickness that allows only the first light after traveling out and back within the multi-stacked semiconductor layer and the ITO contact electrode part via the reflection at the metal electrode part, and the second light to meet in the same phase and exit from a lower side of the multi-quantum well layer.

2. The nitride semiconductor light-emitting element according to claim 1, wherein an optical path length through the multi-stacked semiconductor layer in a film thickness direction is substantially equal to a value obtained by adding an integral multiple of half a wavelength of the first light to one-quarter the wavelength.

3. The nitride semiconductor light-emitting element according to claim 2, wherein the optical path length through the multi-stacked semiconductor layer in the film thickness direction is substantially equal to a value obtained by adding an integral multiple of half a wavelength of the first light to one-quarter the wavelength and then multiplied by Cos θ°, where θ° is an angle formed by the film thickness direction of the multi-stacked semiconductor layer and the first light.

4. The nitride semiconductor light-emitting element according to claim 3, wherein the optical path length through the multi-stacked semiconductor layer in the film thickness direction is within the range of 0.5 times to 0.8 times the wavelength of the first light.

5. The nitride semiconductor light-emitting element according to claim 1, wherein the multi-stacked semiconductor layer has a film thickness in the range from 60 nm to 100 nm.

6. The nitride semiconductor light-emitting element according to claim 1, wherein an optical path length, from an upper surface of any of the plurality of well layers constituting the multi-quantum well layer to an interface between the multi-stacked semiconductor layer and the metal electrode part, is substantially equal to a value obtained by adding an integral multiple of half a wavelength of the first light to one-quarter the wavelength.

7. The nitride semiconductor light-emitting element according to claim 6, wherein the optical path length, from an upper surface of any of the plurality of well layers constituting the multi-quantum well layer to the interface between the multi-stacked semiconductor layer and the metal electrode part, is substantially equal to a value obtained by adding an integral multiple of half a wavelength of the first light to one-quarter the wavelength and then multiplied by Cos θ°.

8. The nitride semiconductor light-emitting element according to claim 1, wherein the multi-stacked semiconductor layer comprises an electron blocking layer located on the multi-quantum well layer side and a p-type cladding layer located on the electron blocking layer and comprising p-type AlGaN.

9. The nitride semiconductor light-emitting element according to claim 1, wherein the multi-stacked semiconductor layer further comprises a p-type contact layer that is located on the p-type cladding layer and comprises p-type GaN.

10. The nitride semiconductor light-emitting element according to claim 9, wherein the p-type cladding layer comprises a first p-type cladding layer located on the electron blocking layer side and comprising p-type AlGaN with a first composition ratio, and a second p-type cladding layer located on the p-type contact layer side and comprising p-type AlGaN with a second composition ratio smaller than the first composition ratio.

11. The nitride semiconductor light-emitting element according to claim 1, wherein the multi-stacked semiconductor layer further comprises a tunnel junction that is located on the p-type cladding layer.

12. The nitride semiconductor light-emitting element according to claim 11, wherein the tunnel junction comprises a p-type layer comprising a p-type semiconductor and an n-type layer comprising an n-type semiconductor.

* * * * *